(12) United States Patent
Nemoto et al.

(10) Patent No.: US 10,472,715 B2
(45) Date of Patent: Nov. 12, 2019

(54) NITRIDE SEMICONDUCTOR TEMPLATE, MANUFACTURING METHOD THEREOF, AND EPITAXIAL WAFER

(71) Applicant: SUMITOMO CHEMICAL COMPANY, LIMITED, Tokyo (JP)

(72) Inventors: Shusei Nemoto, Hitachi (JP); Taichiro Konno, Hitachi (JP); Hajime Fujikura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/548,069

(22) PCT Filed: Feb. 17, 2016

(86) PCT No.: PCT/JP2016/054540
§ 371 (c)(1),
(2) Date: Aug. 1, 2017

(87) PCT Pub. No.: WO2016/136548
PCT Pub. Date: Sep. 1, 2016

(65) Prior Publication Data
US 2018/0010246 A1 Jan. 11, 2018

(30) Foreign Application Priority Data
Feb. 27, 2015 (JP) .................. 2015-039553

(51) Int. Cl.
*C23C 16/34* (2006.01)
*C30B 29/38* (2006.01)
(Continued)

(52) U.S. Cl.
CPC ............ *C23C 16/34* (2013.01); *C30B 25/183* (2013.01); *C30B 29/38* (2013.01); *C30B 29/403* (2013.01);
(Continued)

(58) Field of Classification Search
CPC ....... C23C 16/34; C30B 29/38; C30B 29/403; H01L 21/20; H01L 21/0242;
(Continued)

(56) References Cited

U.S. PATENT DOCUMENTS 6,812,051 B2  11/2004  Usui et al.
7,196,399 B2   3/2007  Usui et al.
(Continued)

FOREIGN PATENT DOCUMENTS

JP  2003-113000 A   4/2003
JP  2006-278999 A  10/2006
(Continued)

OTHER PUBLICATIONS

International Search Report (ISR) (PCT Form PCT/ISA/210), in PCT/JP2016/054540, dated May 24, 2016.
(Continued)

*Primary Examiner* — Jasmine J Clark
(74) *Attorney, Agent, or Firm* — McGinn I.P. Law Group, PLLC.

(57) ABSTRACT

A nitride semiconductor template includes a heterogeneous substrate, a first nitride semiconductor layer that is formed on one surface of the heterogeneous substrate, includes a nitride semiconductor and has an in-plane thickness variation of not more than 4.0%, and a second nitride semiconductor layer that is formed on an annular region including an outer periphery of an other surface of the heterogeneous substrate, includes the nitride semiconductor and has a thickness of not less than 1 μm.

26 Claims, 10 Drawing Sheets

(51) Int. Cl.
| | |
|---|---|
| *H01L 21/20* | (2006.01) |
| *H01L 21/205* | (2006.01) |
| *H01L 33/32* | (2010.01) |
| *H01L 21/02* | (2006.01) |
| *H01L 33/00* | (2010.01) |
| *C30B 25/18* | (2006.01) |
| *C30B 29/40* | (2006.01) |

(52) U.S. Cl.
CPC ...... *H01L 21/0242* (2013.01); *H01L 21/0254* (2013.01); *H01L 21/0262* (2013.01); *H01L 21/02458* (2013.01); *H01L 21/02658* (2013.01); *H01L 21/20* (2013.01); *H01L 21/205* (2013.01); *H01L 33/007* (2013.01); *H01L 33/32* (2013.01)

(58) Field of Classification Search
CPC ........... H01L 21/02458; H01L 21/0262; H01L 21/0254; H01L 21/02658; H01L 21/205; H01L 33/32; H01L 33/007
See application file for complete search history.

(56) References Cited

U.S. PATENT DOCUMENTS

| | | | |
|---|---|---|---|
| 7,442,999 | B2 | 10/2008 | Kurachi et al. |
| 2003/0017685 | A1 | 1/2003 | Usui et al. |
| 2005/0029507 | A1 | 2/2005 | Usui et al. |
| 2006/0220192 | A1 | 10/2006 | Kurachi et al. |
| 2009/0173951 | A1 | 7/2009 | Kikkawa et al. |
| 2010/0151658 | A1 | 6/2010 | Abe et al. |
| 2013/0014694 | A1 | 1/2013 | Maeng et al. |
| 2013/0048942 | A1* | 2/2013 | Konno ................ H01L 21/0242 257/13 |
| 2013/0065341 | A1 | 3/2013 | Kai et al. |
| 2013/0069075 | A1* | 3/2013 | Fujikura ................ C30B 25/16 257/76 |
| 2013/0087807 | A1 | 4/2013 | Ikuta et al. |

FOREIGN PATENT DOCUMENTS

| | | |
|---|---|---|
| JP | 3886341 B2 | 2/2007 |
| JP | 2010-147117 A | 7/2010 |
| JP | 2011-066356 A | 3/2011 |
| JP | 2013-021333 A | 1/2013 |
| JP | 2013-062409 A | 4/2013 |
| WO | WO 2008/012877 A1 | 1/2008 |
| WO | WO 2011/161975 A1 | 12/2011 |

OTHER PUBLICATIONS

Notification of Transmittal of Translation of the International Preliminary Report on Patentability (PCT/IB/338) in PCT Application No. PCT/JP2016/054540 dated Sep. 8, 2017 (and English translation of Written Opinion).

Nakamura, et al., "High-Brightness InGaN Blue, Green and Yellow Light-Emitting Diodes with Quantum Well Structures." Jpn. J. Appl. Phys. vol. 34 (1995) pp. L797-L799.

* cited by examiner

NITRIDE SEMICONDUCTOR TEMPLATE, MANUFACTURING METHOD THEREOF, AND EPITAXIAL WAFER

TECHNICAL FIELD

The present invention relates to a nitride semiconductor template, a manufacturing method thereof and an epitaxial wafer.

BACKGROUND ART

Nitride semiconductors such as gallium nitride (GaN), aluminum gallium nitride (AlGaN) and indium gallium nitride (InGaN) have attracted attention as materials for light-emitting elements which can emit light from red to UV.

One of method for growing nitride semiconductor crystal is the hydride vapor phase epitaxy (HYPE) method using a metal chloride gas and ammonia as raw materials. The crystal growth rate when using the HYPE method ranges from not less than 10 μm/h to not less than 100 μm/h and is much higher than the crystal growth rate when using the metal-organic vapor phase epitaxy (MOVPE) method or the molecular beam epitaxy (MBE) method which is typically several μm/h.

For this reason, the HYPE method is often used to manufacture, e.g., GaN free-standing substrate (see, e.g., PTL 1) and MN free-standing substrate. The free-standing substrate here means a substrate having strength which is enough to maintain its shape but does not cause any inconvenience in handling.

Meanwhile, light-emitting diode (LED) formed of a nitride semiconductor is generally formed on a sapphire substrate. For crystal growth in this case, a buffer layer is formed on a surface of the substrate, and then, a thick GaN layer of about 10 to 15 μm including an n-type cladding layer, an InGaN/GaN multiple quantum well light-emitting layer (total thickness of several hundred nm) and a p-type cladding layer (thickness of 200 to 500 nm) are formed in this order on the buffer layer. The reason why the GaN layer located under the light-emitting layer is thick is that GaN on the sapphire substrate can have high crystallinity.

When crystal is grown by the MOVPE method, time required to form such LED structure is typically about 6 hours, about half of which is spent to grow the GaN layer, called template, located under the light-emitting layer. Considering this fact, if the HYPE method with significantly high growth rate can be used to grow a template portion, it is possible to significantly reduce growth time, leading to drastic reduction in the LED wafer manufacturing cost.

Meanwhile, when manufacturing nitride semiconductor template, there is a problem of warpage caused by a large difference in thermal expansion coefficient between sapphire and nitride semiconductor layer, regardless of the crystal growth method. For example, in case that a GaN layer having a thickness of about 10 to 15 μm is grown on a sapphire substrate having a general size, warpage of about 120 to 180 μm occurs when the sapphire substrate has a diameter of 50.8 mm and a thickness of 430 μm±15 μm, warpage of about 260 to 400 μm occurs when the sapphire substrate has a diameter of 100 mm and a thickness of 650 μm±20 μm, and warpage of about 160 to 240 μm occurs when the sapphire substrate has a diameter of 150 mm and a thickness of 1300 μm±25 μm.

To reduce the amount of warpage, the thickness of the sapphire substrate could be increased or the thickness of the nitride semiconductor layer could be reduced. However, theses cause problems that the cost increases when increasing the thickness of the sapphire substrate and crystal quality decreases when reducing the thickness of the nitride semiconductor layer.

Other than those, a method in which a stress-offset layer is formed on the back surface of the substrate (see, e.g., PTL 2) and a method in which a stress relaxation layer is formed on the back and side surfaces of the substrate (see, e.g., PTL 3) are also known as the methods of reducing warpage of nitride semiconductor template.

CITATION LIST

Patent Literature

[PTL 1]
JP-B-3886341
[PTL 2]
JP-A-2003-113000
[PTL 3]
JP-A-2006-278999

SUMMARY OF INVENTION

Technical Problem

When using the method disclosed in PTL 2, the stress-offset layer on the back surface of the substrate needs to be formed before growing the nitride semiconductor layer on the front surface of the substrate. When using the method disclosed in PTL 3, the stress relaxation layer on the back and side surfaces of the substrate needs to be formed after growing the nitride semiconductor layer on the front surface of the substrate. Since the stress-offset layer or the stress relaxation layer is formed separately from the nitride semiconductor layer, throughput of the entire process for manufacturing nitride semiconductor template decreases significantly.

It is one of objects of the invention to provide a nitride semiconductor template and a manufacturing method thereof which can reduce warpage and maintain good crystallinity of nitride semiconductor layer without causing a great decrease in throughput, and also to provide an epitaxial wafer including such nitride semiconductor template.

Solution to Problem

A nitride semiconductor template defined by [1] to [6] is provided according to one embodiment of the invention. An epitaxial wafer defined by [7] and a method for manufacturing a nitride semiconductor template defined by [8] to [11] are also provided according to other embodiments of the invention.

[1] A nitride semiconductor template, comprising: a heterogeneous substrate; a first nitride semiconductor layer that is formed on one surface of the heterogeneous substrate, comprises a nitride semiconductor and has an in-plane thickness variation of not more than 4.0%; and a second nitride semiconductor layer that is formed on an annular region including an outer periphery of an other surface of the heterogeneous substrate, comprises the nitride semiconductor and has a thickness of not less than 1 μm.

[2] The nitride semiconductor template defined by [1], wherein the heterogeneous substrate comprises a circular substrate, and wherein the annular region comprises a region in the other surface outside a circle that is centered at a center of the heterogeneous substrate and has a 2-mm smaller radius than a radius of the heterogeneous substrate.

[3] The nitride semiconductor template defined by [1] or [2], wherein a shape of a region in the other surface surrounded by the annular region is a circle centered at a center of the heterogeneous substrate.

[4] The nitride semiconductor template defined by any one of [1] to [3], wherein an amount of warpage (Warp) is not more than 100 μm.

[5] The nitride semiconductor template defined by [4], wherein a difference in thickness between the first nitride semiconductor layer and the second nitride semiconductor layer is not more than 5 μm.

[6] The nitride semiconductor template defined by any one of [1] to [5], wherein the nitride semiconductor comprises GaN.

[7] An epitaxial wafer, comprising: the nitride semiconductor template defined by any one of [1] to [6]; and a light-emitting layer formed on the semiconductor template.

[8] A method for manufacturing a nitride semiconductor template, comprising: a step that a first nitride semiconductor layer comprising a nitride semiconductor and having an in-plane thickness variation of not more than 4.0% is grown on one surface of a heterogeneous substrate; and a step that a second nitride semiconductor layer comprising the nitride semiconductor and having a thickness of not less than 1 μm is grown on an annular region including an outer periphery of an other surface of the heterogeneous substrate.

[9] The method for manufacturing a nitride semiconductor template defined by [8], wherein the first nitride semiconductor layer and the second nitride semiconductor layer are grown by holding the heterogeneous substrate onto a substrate holder to be inclined at an angle of not less than 0.5° and not more than 30° with respect to an upper surface of a base of the substrate holder, and sending source gases in one or both of parallel and perpendicular directions to the upper surface of the base of the substrate holder while in-plane rotating the substrate holder.

[10] The method for manufacturing a nitride semiconductor template defined by [8] or [9], wherein the heterogeneous substrate comprises a circular substrate or comprises a circular substrate with at least one of an orientation flat and an index flat, and wherein the annular region comprises a region in the other surface outside a circle that is centered at a center of the heterogeneous substrate and has a 2-mm smaller radius than a radius of the heterogeneous substrate.

[11] The method for manufacturing a nitride semiconductor template defined by any one of [8] to [10], wherein a shape of a region in the other surface surrounded by the annular region is a circle centered at a center of the heterogeneous substrate.

Advantageous Effects of Invention

According to one embodiment of the invention, it is possible to provide a nitride semiconductor template and a manufacturing method thereof which can reduce warpage and maintain good crystallinity of nitride semiconductor layer without causing a great decrease in throughput, and also to provide an epitaxial wafer including such nitride semiconductor template.

DESCRIPTION OF EMBODIMENTS

Figure 1:
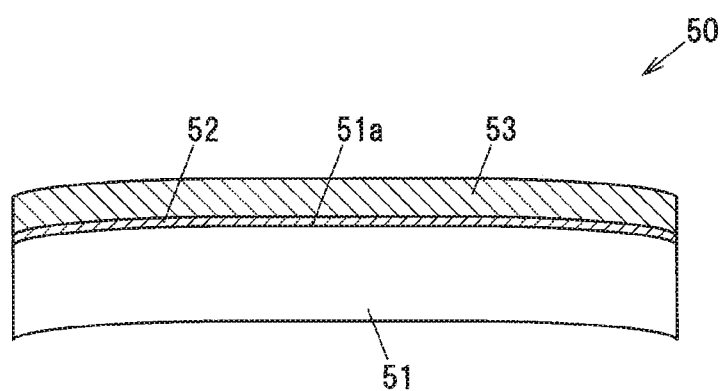
FIG. 1 is a vertical cross-sectional view showing a conventional nitride semiconductor template.

FIG. 1 is a vertical cross-sectional view showing a conventional nitride semiconductor template 50.

The nitride semiconductor template 50 has a heterogeneous substrate 51 such as sapphire substrate, Si substrate or SiC substrate, and a nitride semiconductor layer 53 formed on a plane 51a of the heterogeneous substrate 51 via a buffer layer 52 by epitaxial growth.

A coefficient of thermal expansion of the heterogeneous substrate 51 is different from that of the nitride semiconductor layer 53. Therefore, when the temperature is lowered from high temperature to room temperature after growing the nitride semiconductor layer 53, the nitride semiconductor template 50 is warped.

For example, while sapphire has a coefficient of thermal expansion of $7.5 \times 10^{-6}$/K in the a-axis direction and $8.5 \times 10^{-6}$/K in the c-axis direction, GaN has a coefficient of thermal expansion of $5.59 \times 10^{-6}$/K in the a-axis direction and $3.17 \times 10^{-6}$/K in the c-axis direction which are smaller than the coefficient of thermal expansion of sapphire crystal.

Therefore, when the heterogeneous substrate 51 is a c-plane sapphire substrate and the nitride semiconductor layer 53 is a c-plane GaN substrate, the nitride semiconductor template 50 is warped in such a manner that the plane 51a, which is a growth plane of the nitride semiconductor layer 53, becomes convex, as shown in FIG. 1.

The warpage of the nitride semiconductor template 50 increases with an increase in thickness of the nitride semiconductor layer 53. However, the nitride semiconductor layer 53 needs to be thick to increase crystallinity of the nitride semiconductor layer 53. Thus, improvement in crystallinity of the nitride semiconductor layer 53 and reduction in warpage of the nitride semiconductor template 50 are in a trade-off relation.

For example, when the nitride semiconductor template 50 having a GaN layer as the nitride semiconductor layer 53 is used to manufacture LED (light-emitting diode), it is generally preferable that the X-ray rocking curve of the nitride semiconductor layer 53 have a full width at half maximum of not more than 300 arcsec for a (0004) plane and a full width at half maximum of not more than 400 arcsec for a (10-12) plane. Since the nitride semiconductor layer 53 needs to have a thickness of not less than 5 µm, preferably not less than 10 µm, to have such level of crystallinity, warpage of the nitride semiconductor template 50 becomes inevitably large.

Next, a nitride semiconductor template in the embodiment of the invention which can be manufactured while reducing warpage and maintaining good crystallinity of nitride semiconductor layer will be described.

[First Embodiment]
(Configuration of Nitride Semiconductor Template)

Figure 2:
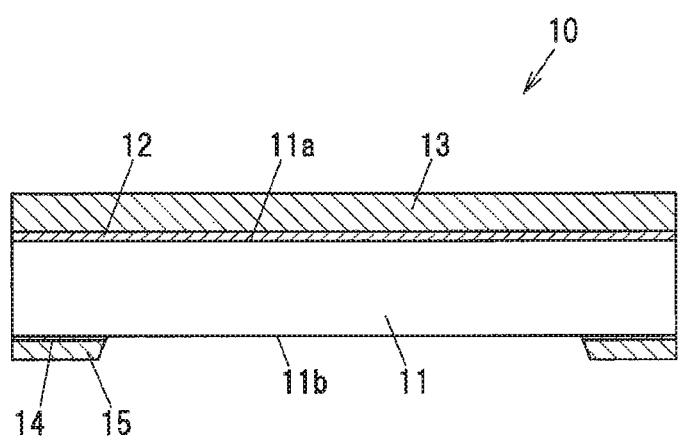
FIG. 2 is a vertical cross-sectional view showing a nitride semiconductor template in the first embodiment of the present invention.

FIG. 2 is a vertical cross-sectional view showing a nitride semiconductor template 10 in the first embodiment of the invention.

As shown in FIG. 2, the nitride semiconductor template 10 has a heterogeneous substrate 11, a first nitride semiconductor layer 13 which is formed on a plane 11a of the heterogeneous substrate 11 via a buffer layer 12 and has an in-plane thickness variation of not more than 4.0%, and a second nitride semiconductor layer 15 which is formed on a plane 11b of the heterogeneous substrate 11 via a buffer layer 14 and has a thickness of not less than 1 µm.

The in-plane thickness variation of the first nitride semiconductor layer 13 is obtained as follows. Firstly, line segments respectively extending in the x-axis and y-axis directions and orthogonal to each other are drawn inside a circle which is centered at the center of the front surface of the first nitride semiconductor layer 13 and has a 3-mm smaller radius than the radius of the first nitride semiconductor layer 13. Then, each line segment is divided into five equal parts and the film thickness is measured at the locations dividing the line segments (at nine measurement points in total). The value of the standard deviation of film thickness obtained at nine locations is divided by the average film thickness of the nine locations, and the obtained value is defined as an in-plane thickness variation of the first nitride semiconductor layer 13.

The heterogeneous substrate 11 is a substrate formed of a material other than nitride semiconductor, and is, e.g., a sapphire substrate or a SiC substrate, etc. The heterogeneous substrate 11 may be a FSS (Flat Sapphire Substrate), which is a general flat substrate, or may be a PSS (Patterned Sapphire Substrate) having plural raised portions on a surface.

The heterogeneous substrate 11 may be a double-mirror-surface substrate having mirror surfaces on both the planes 11a and 11b, or a single-mirror-surface substrate having a mirror surface on the plane 11a and a lapped and etched surface on the plane 11b. However, in case of using the single-mirror-surface substrate, a difference in growth rate between the first nitride semiconductor layer 13 and the second nitride semiconductor layer 15 may be too large depending on the surface condition of the plane 11b. In such a case, it is necessary to firstly check the growth rates and then adjust the growth conditions so that a difference in thickness between the first nitride semiconductor layer 13 and the second nitride semiconductor layer 15 is not excessively large.

In addition, the heterogeneous substrate 11 is typically a circular substrate, but may be a substrate having a different shape. The circular substrate here includes a substrate having a circular shape with at least one of an orientation flat and an index flat.

The first nitride semiconductor layer 13 and the second nitride semiconductor layer 15 are formed of the same nitride semiconductor and are simultaneously formed in the same process. The nitride semiconductor constituting the first nitride semiconductor layer 13 and the second nitride semiconductor layer 15 is a material with a composition expressed by $Al_xIn_yGa_zN$ ($0 \leq x \leq 1$, $0 \leq y < 1$, $0 \leq z \leq 1$, $x+y+z \leq 1$), and may contain a dopant. Typically, the first nitride semiconductor layer 13 and the second nitride semiconductor layer 15 are formed of GaN which does not contain any dopant.

The buffer layer 12 and the buffer layer 14 are formed of a material which serves as a buffer between the crystal of sapphire, etc., constituting the heterogeneous substrate 11 and the crystal of the nitride semiconductor constituting the first nitride semiconductor layer 13 and the second nitride semiconductor layer 15.

The buffer layer 12 and the buffer layer 14 are formed of the same material and are simultaneously formed in the same process. Typically, the buffer layer 12 and the buffer layer 14 are formed of a nitride semiconductor. For example, when the heterogeneous substrate 11 is formed of sapphire and the first nitride semiconductor layer 13 and the second nitride semiconductor layer 15 are formed of GaN, the buffer layer 12 and the buffer layer 14 are formed of AlN.

Figure 3A:
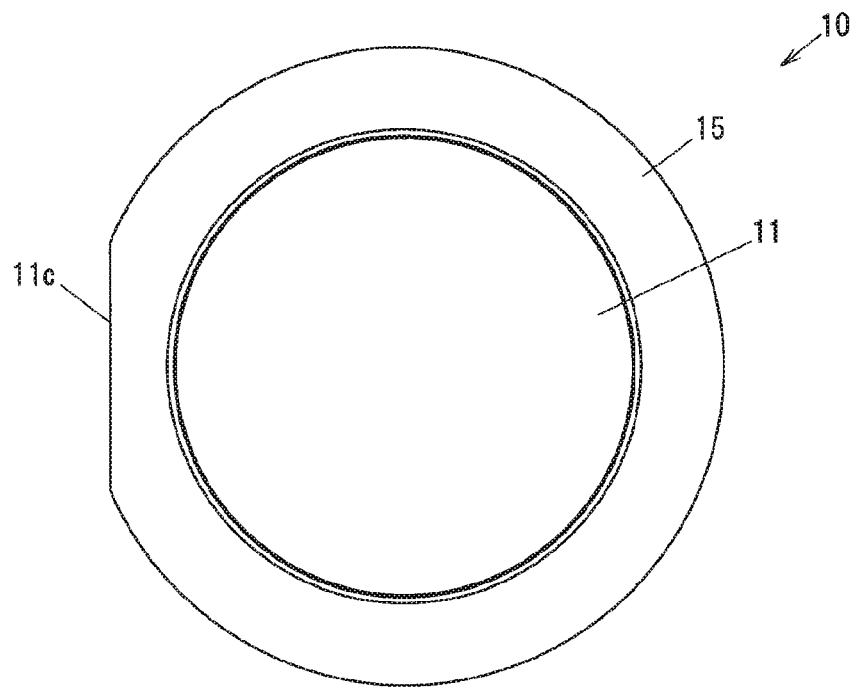
FIG. 3A is a plan view showing the nitride semiconductor template when viewed from the back surface side.

FIG. 3A is a plan view showing the nitride semiconductor template 10 when viewed from the plane 11b side. FIG. 3A shows an example in which the heterogeneous substrate 11 is a circular substrate having an orientation flat.

As shown in FIG. 3A, the second nitride semiconductor layer 15 is formed in an annular region including an outer periphery of the plane 11b. That is, the second nitride semiconductor layer 15 has an annular shape.

It is possible to reduce warpage of the nitride semiconductor template 10 by growing the second nitride semiconductor layer 15 simultaneously with the first nitride semiconductor layer 13. This is because in the nitride semiconductor template 10, stress generated due to a difference in thermal expansion coefficient between the second nitride semiconductor layer 15 and the heterogeneous substrate 11 acts in a direction to cancel out stress generated due to a difference in thermal expansion coefficient between the first nitride semiconductor layer 13 and the heterogeneous substrate 11.

By forming the second nitride semiconductor layer 15 into the annular shape, it is possible to reduce anisotropy of stress generated due to a difference in thermal expansion coefficient between the second nitride semiconductor layer 15 and the heterogeneous substrate 11 and thereby possible to effectively reduce warpage of the nitride semiconductor template 10.

The effect of reducing warpage of the nitride semiconductor template 10 may vary depending on, e.g., the size of the second nitride semiconductor layer 15. However, the present inventors has confirmed that, in case that the heterogeneous substrate 11 is a circular substrate or is a circular substrate with an orientation flat 11c as shown in FIG. 3A, a better effect is obtained when the above-described annular region includes a region of the plane 11b outside a circle which is centered at the center of the heterogeneous substrate 11 and has a 2-mm smaller radius than the radius of the heterogeneous substrate 11.

Figure 3B:
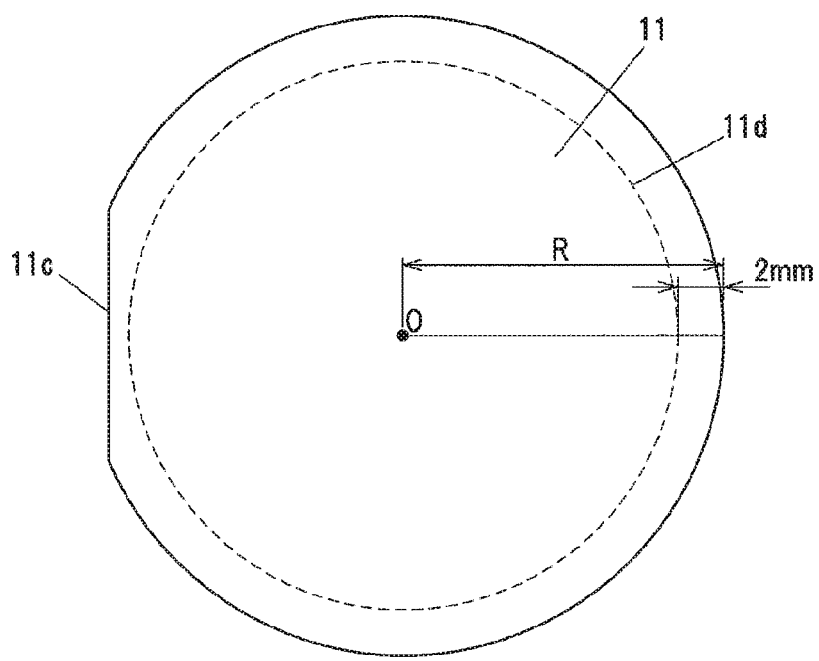
FIG. 3B is an explanatory diagram illustrating a circle on the back surface which is centered at the center of a heterogeneous substrate and has a 2-mm smaller radius than the radius of the heterogeneous substrate.

FIG. 3B is an explanatory diagram illustrating a circle 11*d* on the plane 11*b* which is centered at the center O of the heterogeneous substrate 11 and has a 2-mm smaller radius than the radius of the heterogeneous substrate 11.

As shown in FIG. 3B, the heterogeneous substrate 11 has the orientation flat 11*c* but the center O thereof is the same as the center before forming the orientation flat 11*c*. In addition, R in the drawing indicates the radius of the heterogeneous substrate 11, i.e., a distance between the center O and an arc portion of the outer periphery.

Although an excellent effect of reducing warpage of the nitride semiconductor template 10 is obtained when the annular region, regardless of the shape or size, for forming the second nitride semiconductor layer 15 includes a region of the plane 11*b* outside the circle 11*d* as described above, the shape of the region of the plane 11*b* surrounded by the annular region is preferably a circle centered at the center O as shown in FIG. 3A. In this case, the shape of the second nitride semiconductor layer 15 is a substantially concentric circle (in case of not providing the orientation flat 11*c*, a concentric circle).

When displacement distribution of warpage of the nitride semiconductor template 10 is in a concentric circular shape, an impact of warpage on crystal quality, etc., is minimized. When the shape of the second nitride semiconductor layer 15 is a substantially concentric circle, displacement distribution of residual warpage of the nitride semiconductor template 10 can be a concentric circular shape.

The present inventors has confirmed that when the annular region includes a region outside the circle centered at the center of the heterogeneous substrate 11 and having a 2-mm smaller radius than the radius of the heterogeneous substrate 11 and also the shape of the region of the plane 11*b* surrounded by the annular region is a circle centered at the center O, warpage of the nitride semiconductor template 10 can be reduced to substantially the same level as when the second nitride semiconductor layer 15 is formed on the entire plane 11*b*.

Furthermore, it was also confirmed that when the heterogeneous substrate 11 is a sapphire substrate having a thickness in a general specification (e.g., 430 µm±15 µm when the diameter is 50.8 mm, 650 µm±20 µm when the diameter is 100 mm, and 1300 µm±25 µm when the diameter is 150 mm), the amount of warpage (Warp) of the nitride semiconductor template 10 is suppressed to not more than 100 µm by forming the first nitride semiconductor layer 13 and the second nitride semiconductor layer 15 so as to have a thickness difference of not more than 5 µm under the conditions described above, and the amount of warpage (Warp) of the nitride semiconductor template 10 is suppressed to not more than 30 µm by forming the first nitride semiconductor layer 13 and the second nitride semiconductor layer 15 so as to have a thickness difference of not more than 1 µm. Warp representing the amount of warpage is the sum of the absolute values of the distances from a 3-point reference plane of the surface of the nitride semiconductor template 10 to the highest and lowest points. Three points of the 3-point reference plane are points on the surface of the nitride semiconductor template 10 which are spaced at 120° intervals and located on a circle centered at the center of the surface of the nitride semiconductor template 10 and having a radius which is 97% of the radius of the nitride semiconductor template 10.

If the amount of warpage (Warp) of the nitride semiconductor template 10 is more than 100 µm, problems occur during an LED forming process in which a light-emitting layer is grown on the nitride semiconductor template 10, such that in-plane uniformity of growth of the light-emitting layer decreases or it is difficult to vacuum-suck the back surface of the heterogeneous substrate 11 during the process. Therefore, the amount of warpage (Warp) of the nitride semiconductor template 10 is preferably not more than 100 µm.

When the heterogeneous substrate 11 is thinner than the thickness in the general specification, the amount of warpage (Warp) of the nitride semiconductor template 10 could be more than 100 µm even when the difference in thickness between the first nitride semiconductor layer 13 and the second nitride semiconductor layer 15 is adjusted to not more than 5 µm. In such a case, the amount of warpage (Warp) of the nitride semiconductor template 10 can be suppressed to not more than 100 µm by further reducing the difference in thickness between the first nitride semiconductor layer 13 and the second nitride semiconductor layer 15. It is possible to reduce the cost of the heterogeneous substrate 11 by using a thin heterogeneous substrate 11.

The thickness of the second nitride semiconductor layer 15 is not less than 1 µm as described above. This is because when the thickness of the second nitride semiconductor layer 15 is less than 1 µm, the effect of reducing the amount of warpage (Warp) of the nitride semiconductor template 10 is small even if the difference in thickness between the first nitride semiconductor layer 13 and the second nitride semiconductor layer 15 is reduced.

Also when growing a nitride semiconductor layer only on a front surface of a substrate as is in a process of manufacturing a conventional nitride semiconductor template, a layer of several nm to several tens nm in thickness is sometimes grown on the back surface of the substrate due to a trace amount of source gases which flow around to the back side. Even if the difference in thickness between the first nitride semiconductor layer 13 and the second nitride semiconductor layer 15 is small similar to this case, the effect of reducing the amount of warpage of the nitride semiconductor template 10 is small.

(Method for Manufacturing the Nitride Semiconductor Template)

Since nitride semiconductor layers are grown on both surfaces of the substrate when manufacturing the nitride semiconductor template 10 in the first embodiment, the crystal growth rate is lower than when growing a nitride semiconductor layer only on one surface of the substrate. For this reason, the HYPE method with a significantly higher crystal growth rate than the MOVPE method or the MBE method is preferably used to manufacture the nitride semiconductor template 10. Next, an example of a method for manufacturing the nitride semiconductor template 10 when using the HYPE method will be described.

[Configuration of HYPE Apparatus]

Figure 4:
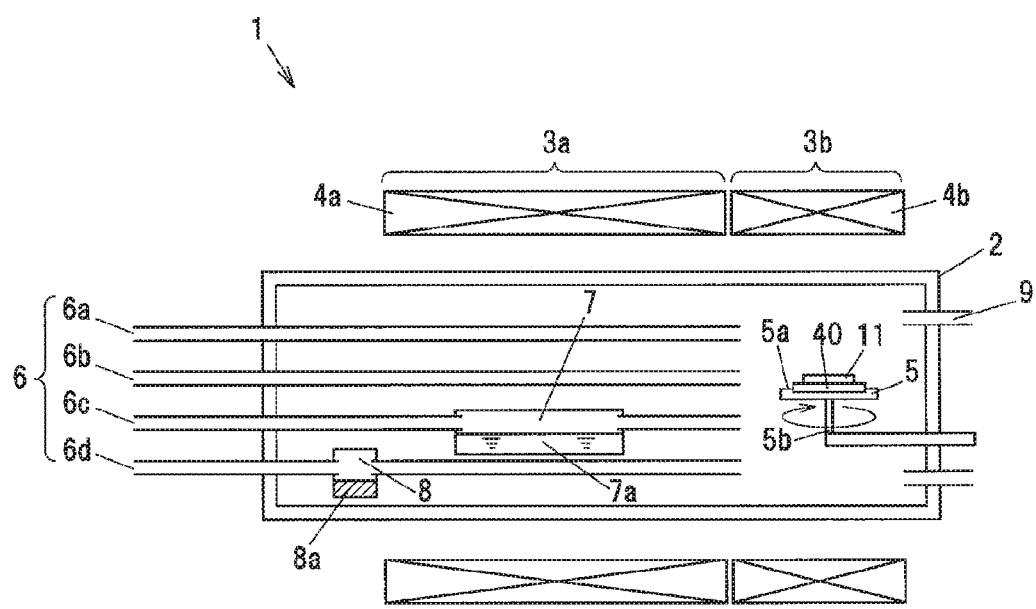
FIG. 4 is a vertical cross-sectional view showing a HVPE apparatus used to manufacture the semiconductor template in the first embodiment of the invention.

FIG. 4 is a vertical cross-sectional view showing a HYPE apparatus 1 used to manufacture the semiconductor template 10 in the first embodiment of the invention.

The HYPE apparatus 1 has a reaction furnace 2 having a source region 3*a* for producing source gases of the buffer layer 12, the first nitride semiconductor layer 13, the buffer layer 14 and the second nitride semiconductor layer 15, and a growth region 3*b* for crystal growth of the buffer layer 12, the first nitride semiconductor layer 13, the buffer layer 14 and the second nitride semiconductor layer 15 on the substrate 11 placed therein.

The source region 3a and the growth region 3b are respectively heated to, e.g., about 850° C. and 1200° C. by a heater 4a and a heater 4b. The source region 3a is located upstream of flows of the source gases, etc., and the growth region 3b is located downstream.

The HYPE apparatus 1 also has four gas supply lines 6; a doping line 6a, a group V line 6b, a group III (Ga) line 6c and a group III (Al) line 6d, extending in the source region 3a toward the growth region 3b.

A hydrogen gas, a nitrogen gas or a mixture thereof as a carrier gas is supplied together with a $NH_3$ gas as a nitrogen source from the group V line 6b.

A hydrogen gas, a nitrogen gas or a mixture thereof as a carrier gas is supplied together with a HCl gas from the group III line 6c. A tank 7 for containing metal gallium (Ga) is located at the middle of the group III line 6c, and a Ga melt 7a is contained in the tank 7. A GaCl gas is produced by reaction of the metal Ga with the HCl gas supplied through the group III line 6c and is then sent to the growth region 3b.

A hydrogen gas, a nitrogen gas or a mixture thereof as a carrier gas is supplied together with a HCl gas from the group III line 6d. A tank 8 for containing metal aluminum (Al) is located at the middle of the group III line 6d, and solid aluminum pellets 8a are contained in the tank 8. An $AlCl_3$ gas is produced by reaction of the metal Al with the HCl gas supplied through the group III line 6d and is then sent to the growth region 3b.

The gases introduced through the doping line 6a are, e.g., a hydrogen-nitrogen mixed gas when growing a non-dopant-containing crystal layer such as undoped GaN layer (un-GaN layer), and are, e.g., a dichlorosilane gas as a Si source (hydrogen dilution, 100 ppm), a HCl gas, a hydrogen gas and a nitrogen gas when growing a dopant-containing crystal layer such as n-type GaN layer. Meanwhile, during baking which is performed after crystal growth to remove a GaN-based substance attached to the inside of the HYPE apparatus 1, a HCl gas, a hydrogen gas and a nitrogen gas are introduced through the doping line 6a.

A tray 5 which rotates in-plane at a rotational speed of about 3 to 100 r/min is placed in the growth region 3b, a substrate holder 40 for holding a substrate is mounted on a surface 5a of the tray 5 which is parallel to outlet portions of the gas supply lines 6, and the heterogeneous substrate 11 is held by the substrate holder 40. Fitting portions for securely positioning the substrate holder 40 are provided on the surface 5a of the tray 5.

Various source gases introduced from the outlets of the gas supply lines 6 react on the surfaces of the heterogeneous substrate 11, thereby growing the buffer layer 12, the first nitride semiconductor layer 13, the buffer layer 14 and the second nitride semiconductor layer 15. The source gases, etc., flowing past the heterogeneous substrate 11 are exhausted from the downstream end of the reaction furnace 2 through lines 9.

The respective pipes of the gas supply lines 6, the tanks 7, 8 and a rotating shaft 5b of the tray 5 are formed of high purity quartz, and the tray 5 is formed of SiC-coated carbon.

[Method of Mounting the Heterogeneous Substrate on HVPE Apparatus]

Next, a substrate holder 41 used in Example 1 (described later) will be described as an example of the substrate holder 40.

Figure 7A:
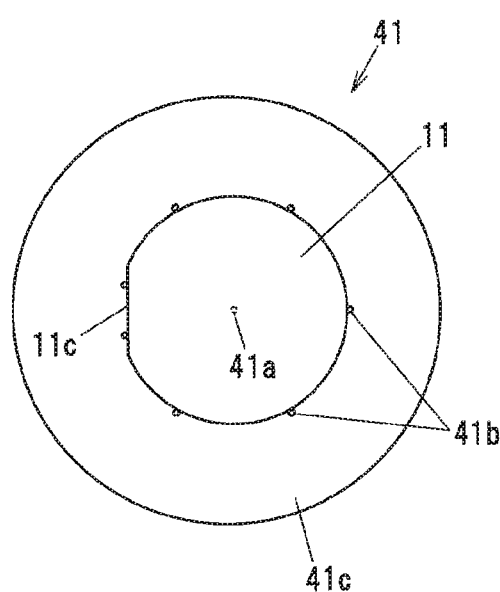
FIG. 7A is a top view showing the heterogeneous substrate held by a substrate holder in Example 1.
Figure 7B:
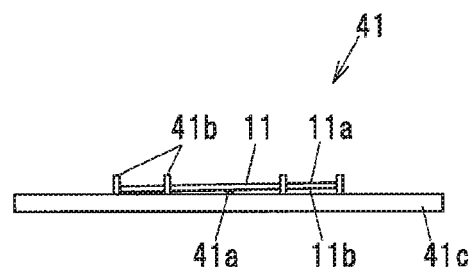
FIG. 7B is a side view showing the heterogeneous substrate held by the substrate holder in Example 1.

FIGS. 7A and 7B are respectively top and side views showing the heterogeneous substrate 11 held by the substrate holder 41 which is an example of the substrate holder 40.

The substrate holder 41 has a plate-shaped base 41c, a protrusion 41a for supporting the heterogeneous substrate 11 at the center or near the center of the plane 11b, and plural protrusions 41b for supporting the side surface of the heterogeneous substrate 11. The upper surface of the protrusion 41a has a predetermined inclination with respect to the upper surface of the base 41c, and the heterogeneous substrate 11 is held by the substrate holder 41 at such predetermined inclination.

By growing crystal while rotating the tray 5 with the substrate holder 41 mounted thereon in the state that the heterogeneous substrate 11 has a predetermined inclination with respect to the upper surface of the base 41c, it is possible to simultaneously grow the first nitride semiconductor layer 13 on the plane 11a of the heterogeneous substrate 11 and the second nitride semiconductor layer 15 on the plane 11b.

The predetermined inclination of the heterogeneous substrate 11 with respect to the upper surface of the base 41c is preferably not less than 0.5° and not more than 30°. When less than 0.5°, the source gases may hardly flow around to the plane 11b side, resulting in insufficient growth of the second nitride semiconductor layer 15. On the other hand, if more than 30°, the first nitride semiconductor layer 13 grown on the plane 11a tends to have less film thickness distribution uniformity and lower crystallinity.

Although a preferable inclination angle of the heterogeneous substrate 11 depends on the source gas feeding direction in the HYPE apparatus 1 and is different when parallel, perpendicular, and both parallel and perpendicular to the upper surface of the base 41c, it is possible to grow the first nitride semiconductor layer 13 and the second nitride semiconductor layer 15 without problem in each case as long as the inclination is not less than 0.5° and not more than 30° with respect to the upper surface of the base 41c.

The physical limit of the inclination angle of the heterogeneous substrate 11 varies depending on the structure of the HYPE apparatus 1. Therefore, it is necessary to be careful particularly when inclining at a large angle.

When the substrate holder 41 is configured to hold the heterogeneous substrate 11 with a small gap from the base 41c, the second nitride semiconductor layer 15 is grown on the plane 11b more efficiently.

In the first embodiment, since the first nitride semiconductor layer 13 on the plane 11a of the heterogeneous substrate 11 and the second nitride semiconductor layer 15 on the plane 11b are simultaneously grown, the crystal growth rate which can be achieved is only about ½ to ¾ of the crystal growth rate when growing a nitride semiconductor layer only on the front surface of the substrate. However, it is a relatively efficient growth method since time to place and take out the substrate can be halved and also material efficiency is good as compared to when separately growing nitride semiconductor layers on the front and back surfaces of the substrate.

The second nitride semiconductor layer 15 never grows on the entire plane 11b of the heterogeneous substrate 11 since the protrusion 41a of the substrate holder 41 is in contact with the plane 11b. For example, in order that the annular region of the plane 11b on which the second nitride semiconductor layer 15 is grown includes a region of the plane 11b outside a circle centered at the center O of the heterogeneous substrate 11 and having a 2-mm smaller radius than the radius of the heterogeneous substrate 11, the upper surface of the protrusion 41a needs to be smaller than the circle. In addition, when the upper surface of the protrusion 41a has a circular shape, the shape of the region of the plane 11b surrounded by the annular region on which the second nitride semiconductor layer 15 is grown is a circle centered at the center O.

The substrate holder 41 is only an example of the substrate holder 40 as described above, and the structure of the substrate holder 40 is not specifically limited as long as it is a structure which can immovably secure the heterogeneous substrate 11 at a predetermined angle and allows the first nitride semiconductor layer 13 and the second nitride semiconductor layer 15 to simultaneously grow. For example, the shape, number and arrangement, etc., of the protrusions are not limited. However, a protrusion(s) for supporting the orientation flat 11c of the heterogeneous substrate 11 is preferably provided to prevent the heterogeneous substrate 11 from moving during rotation.

The material of the substrate holder 40 is preferably carbon, SiC or quartz. In addition, an edge of the upper surface of the protrusion supporting the plane 11b of the heterogeneous substrate 11 is preferably tapered or rounded. In this case, the source gases flow and crystal grows along the tapered surface or rounded surface. This allows gradual film thickness variation at the inner edge of the second nitride semiconductor layer 15 and, for example, troubles etc. at the time of vacuum-lifting during the LED forming process are less likely to occur.

The tray 5 and the substrate holder 40 held by the tray 5 are rotated in-plane when growing the first nitride semiconductor layer 13 and the second nitride semiconductor layer 15.

Once the nitride semiconductor template 10 is manufactured, a GaN-based substance is attached to the used substrate holder 40 and needs to be regularly removed by baking in an atmosphere of HCl gas, etc.

(Effects of the First Embodiment)

According to the first embodiment, it is possible to effectively reduce warpage of the nitride semiconductor template 10. In addition, since warpage of the nitride semiconductor template 10 is effectively reduced, it is possible to grow a thick first nitride semiconductor layer 13 and to improve the crystallinity thereof.

In addition, since the first nitride semiconductor layer 13 on the plane 11a of the heterogeneous substrate 11 and the second nitride semiconductor layer 15 on the plane 11b are simultaneously grown, it is possible to increase throughput and material efficiency as compared to when growing nitride semiconductor layers on the front and back surfaces of the substrate in separate steps.

[Second Embodiment]

The second embodiment is an epitaxial wafer as an example of element which is formed using the nitride semiconductor template in the first embodiment. The explanation for the same features as the first embodiment, such as the configuration of the nitride semiconductor template, will be omitted or simplified.

Figure 5:
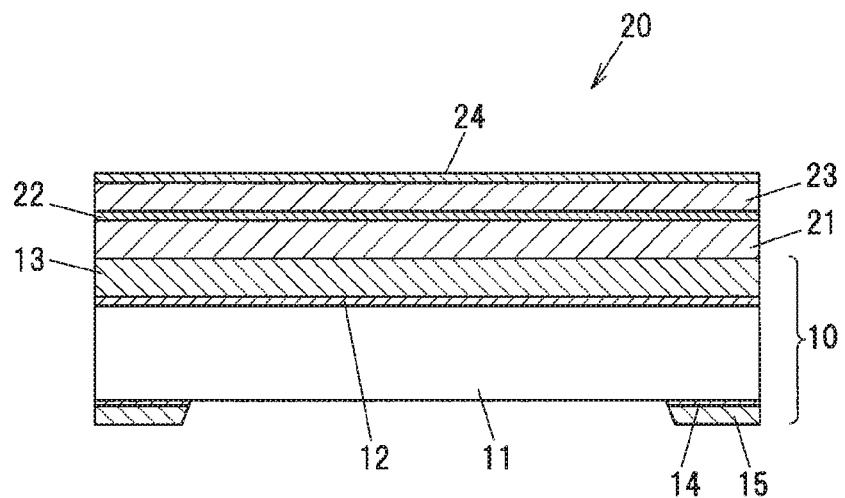
FIG. 5 is a vertical cross-sectional view showing an epitaxial wafer for light-emitting element in the second embodiment of the invention.

FIG. 5 is a vertical cross-sectional view showing an epitaxial wafer 20 for light-emitting element in the second embodiment of the invention. The epitaxial wafer 20 is a wafer formed using the nitride semiconductor template 10 in the first embodiment.

The epitaxial wafer 20 has the nitride semiconductor template 10, an n-type layer 21 formed on the nitride semiconductor template 10, a light-emitting layer 22 formed on the n-type layer 21, a p-type layer 23 formed on the light-emitting layer 22, and a contact layer 24 formed on the p-type layer 23.

The heterogeneous substrate 11 of the epitaxial wafer 20 is, e.g., a sapphire substrate. Meanwhile, the nitride semiconductor layer 13 is, e.g., an undoped GaN layer having a thickness of about 10 to 15 μm. The nitride semiconductor layer 13 is formed thick to improve crystal quality, etc.

The n-type layer 21 is, e.g., an n-type GaN layer. The light-emitting layer 22 is, e.g., a multi-quantum well layer composed of six pairs of InGaN/GaN. The p-type layer 23 is, e.g., a p-type AlGaN layer. The contact layer 24 is, e.g., a p-type GaN layer.

To form the n-type layer 21, the light-emitting layer 22, the p-type layer 23 and the contact layer 24 on the nitride semiconductor template 10, it is possible to use, e.g., the MOVPE method.

(Effects of the Second Embodiment)

Each layer of the epitaxial wafer 20 in the second embodiment is formed on the nitride semiconductor template 10 with small warpage and having the first nitride semiconductor layer 13 excellent in crystallinity, and thus has high crystallinity.

[Third Embodiment]

The third embodiment is a light-emitting element as an example of element which is formed using the epitaxial wafer 20 in the second embodiment. The explanation for the same features as the second embodiment, such as the configuration of the epitaxial wafer 20, will be omitted or simplified.

(Configuration of Light-Emitting Element)

Figure 6:
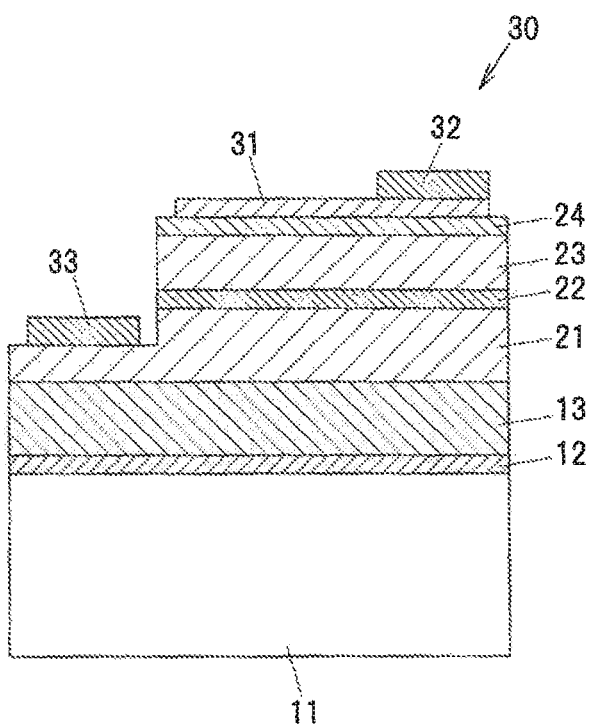
FIG. 6 is a vertical cross-sectional view showing a light-emitting element in the third embodiment of the invention.

FIG. 6 is a vertical cross-sectional view showing a light-emitting element 30 in the third embodiment of the invention. The light-emitting element 30 is an LED element formed using the epitaxial wafer 20.

The light-emitting element 30 has the epitaxial wafer 20 cut into a chip size, an n-side electrode pad 33 formed on a partially exposed region of the n-type layer 21 of the epitaxial wafer 20, a transparent electrode 31 formed on the contact layer 24, and a p-side electrode pad 32 formed on the transparent electrode 31.

The transparent electrode 31 is, e.g., a Ni/Au semi-transparent electrode. The p-side electrode pad 32 and the n-side electrode pad 33 are, e.g., Ti/Al electrodes.

(Effects of the Third Embodiment)

The light-emitting element 30 in the third embodiment is manufactured using the epitaxial wafer 20 having high crystallinity and thus has high brightness and high reliability. It is also possible to use the nitride semiconductor template 10 to manufacture other elements such as transistor, in addition to the light-emitting element.

EXAMPLES

Nitride semiconductor templates manufactured according to the first embodiment were evaluated. The results will be described below.

In the following Examples and Comparative Examples, the nitride semiconductor templates were formed by the HYPE apparatus 1 in the first embodiment. In the HYPE apparatus 1, the source gases were fed in a direction parallel to the surface 5a of the tray 5. In addition, in the following Examples and Comparative Examples, crystal growth was performed under normal pressure (1 atm).

In addition, in the following Examples and Comparative Examples, AlN buffer layers were grown as the buffer layers 12 and 14 and undoped GaN layers were grown as the first nitride semiconductor layer 13 and the second nitride semiconductor layer 15.

Example 1

(Manufacturing of Nitride Semiconductor Template)

In Example 1, a single-mirror-surface FSS having a diameter of 100 mm and a thickness of 650 μm was used as the heterogeneous substrate 11. Then, the carbon substrate holder 41 shown in FIGS. 7A and 7B was used as the substrate holder 40.

The protrusion 41a supporting the heterogeneous substrate 11 at the center or near the center of the plane 11b was in contact with a circle on the plane 11b which is centered at the center of the heterogeneous substrate 11 and has a 46-mm smaller radius than the radius of the heterogeneous substrate 11 (50 mm).

The heterogeneous substrate 11 was held by the substrate holder 41 at an inclination angle of 0.5° with respect to the upper surface of the base 41c.

Firstly, the substrate holder 41 holding the heterogeneous substrate 11 was set on the tray 5 of the HYPE apparatus 1 and air was evacuated from the furnace by supplying pure nitrogen. Then, the substrate was maintained at a temperature of 1100° C. for 10 minutes in a mixed gas of hydrogen at 3 slm and nitrogen at 7 slm.

Next, AlN crystal films were grown on the heterogeneous substrate 11 for 30 seconds while introducing HCl gas at 50 sccm, hydrogen gas at 2 slm and nitrogen at 1 slm through the group III (Al) line 6d, NH$_3$ gas at 50 sccm and hydrogen gas at 1 slm through the group V line 6b and further introducing HCl gas at 400 sccm and nitrogen gas at 2.6 slm through the doping line 6a, thereby forming the buffer layers 12 and 14.

Next, undoped GaN crystal films were grown on the buffer layers 12 and 14 at a growth rate of 60 μm/h (1 μm/min) for 15 minutes while introducing HCl gas at 100 sccm, hydrogen gas at 2 slm and nitrogen gas at 1 slm through the group III (Ga) line 6c and NH$_3$ gas at 2 slm and hydrogen gas at 1 slm through the group V line 6b, thereby forming the first nitride semiconductor layer 13 and the second nitride semiconductor layer 15. The nitride semiconductor template 10 was obtained through these steps.

Next, the nitride semiconductor template 10 was cooled until the substrate temperature dropped to around room temperature while supplying NH$_3$ gas at 2 slm and nitrogen gas at 8 slm. Then, the atmosphere in the reaction furnace 2 of the HYPE apparatus 1 was changed to nitrogen by performing nitrogen purge for several tens minutes, and the nitride semiconductor template 10 was subsequently taken out of the HYPE apparatus 1.

(Evaluation of the Nitride Semiconductor Template)

Ten nitride semiconductor templates 10 obtained through the above-described process were subjected to film thickness measurement using a film thickness measuring apparatus, warpage measurement, X-ray rocking curve measurement using an X-ray diffractometer, and surface observation using an optical microscope. The results are shown in Table 1.

In Table 1, "Thickness of Front surface layer" is an average value of the in-plane thickness of the first nitride semiconductor layer 13, "In-plane thickness variation of Front surface layer" is an in-plane thickness variation of the first nitride semiconductor layer 13, "Thickness of Back surface layer" is an average value of the in-plane thickness of the second nitride semiconductor layer 15, "Film thickness difference between Front and Back surface layers" is a difference between the average thickness of the first nitride semiconductor layer 13 and the average thickness of the second nitride semiconductor layer 15, "FWHM, GaN (0004) plane" is a full width at half maximum of X-ray rocking curve from a (0004) plane at the center of the first nitride semiconductor layer 13, "FWHM, GaN (10-12) plane" is a full width at half maximum of X-ray rocking curve from a (10-12) plane at the center of the first nitride semiconductor layer 13, and "Number of Pits" is the number of pits having a diameter of not less than 10 μm on the surface of the first nitride semiconductor layer 13.

In each of the nitride semiconductor templates 10, the second nitride semiconductor layer 15 was formed on the plane 11b of the heterogeneous substrate 11 other than a 2.5 mm-radius region including the center.

In Example 1, the first nitride semiconductor layers 13 had good crystallinity and the nitride semiconductor templates 10 with small warpage were obtained, as shown in Table 1.

Example 2

(Manufacturing of Nitride Semiconductor Template)

Figure 8A:
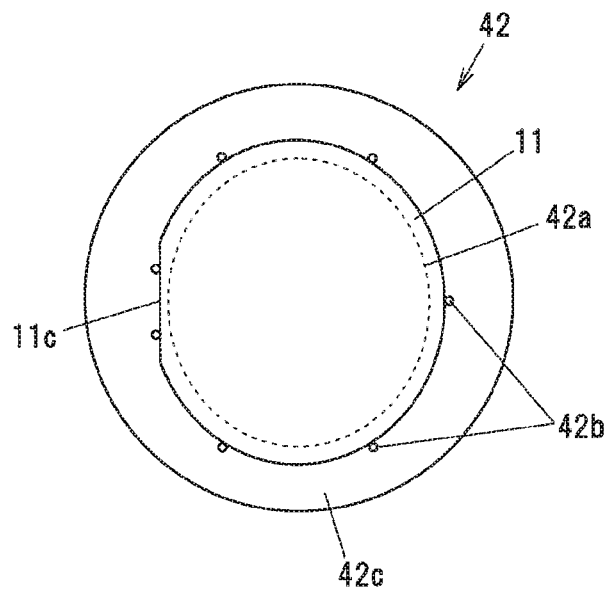
FIG. 8A is a top view showing the heterogeneous substrate held by a substrate holder in Example 2.
Figure 8B:
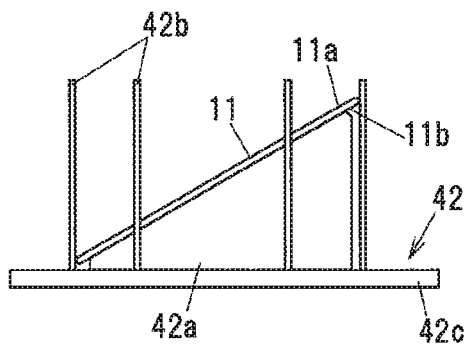
FIG. 8B is a side view showing the heterogeneous substrate held by the substrate holder in Example 2.

In Example 2, a double-mirror-surface FSS having a diameter of 150 mm and a thickness of 1300 μm was used as the heterogeneous substrate 11. Then, a carbon substrate holder 42 shown in FIGS. 8A and 8B was used as the substrate holder 40. FIGS. 8A and 8B are respectively top and side views showing the heterogeneous substrate 11 held by the substrate holder 42 in Example 2.

The substrate holder 42 had a plate-shaped base 42c, a protrusion 42a for supporting the plane 11b of the heterogeneous substrate 11, and plural protrusions 42b for supporting the side surface of the heterogeneous substrate 11. The upper surface of the protrusion 42a had an inclination of 30° with respect to the upper surface of the base 42c, and the heterogeneous substrate 11 was held by the substrate holder 42 at an inclination of 30° with respect to the upper surface of the base 42c.

TABLE 1

| | Thickness of Front surface layer [μm] | In-plane thickness variation of Front surface layer [%] | Thickness of Back surface layer [μm] | Film thickness difference between Front and Back surface layers [μm] | Warpage [μm] | FWHM, GaN (0004) plane [arcsec] | FWHM, GaN (10-12) plane [arcsec] | Number of Pits |
|---|---|---|---|---|---|---|---|---|
| 1 | 10.2 | 1.3 | 7.6 | 2.6 | 68.6 | 231 | 298 | 0 |
| 2 | 10.1 | 1.3 | 7.8 | 2.3 | 65.3 | 226 | 302 | 1 |
| 3 | 10.2 | 1.2 | 7.5 | 2.7 | 67.9 | 231 | 305 | 0 |
| 4 | 10.6 | 1.3 | 7.5 | 3.1 | 71.3 | 238 | 291 | 2 |
| 5 | 10.3 | 1.5 | 7.4 | 2.9 | 69.1 | 233 | 304 | 3 |
| 6 | 10.4 | 1.2 | 7.8 | 2.6 | 64.5 | 227 | 299 | 0 |
| 7 | 10.1 | 1.4 | 7.7 | 2.4 | 65.8 | 229 | 296 | 1 |
| 8 | 10.5 | 1.3 | 7.6 | 2.9 | 70.9 | 236 | 306 | 1 |
| 9 | 10.6 | 1.4 | 7.2 | 3.4 | 75.6 | 238 | 301 | 0 |
| 10 | 10.6 | 1.4 | 7.5 | 3.1 | 72.3 | 230 | 297 | 0 |
| Average | 10.4 | 1.3 | 7.6 | 2.8 | 69.1 | 231.9 | 299.9 | 0.8 |

The protrusion 42a supporting the plane 11b of the heterogeneous substrate 11 was in contact with a circle on the plane 11b which is centered at the center of the heterogeneous substrate 11 and has a 2-mm smaller radius than the radius of the heterogeneous substrate 11 (75 mm).

In Example 2, growth time of undoped GaN crystal films constituting the first nitride semiconductor layer 13 and the second nitride semiconductor layer 15 was 17 minutes but the other steps and the conditions thereof were the same as those in Example 1.

(Evaluation of the Nitride Semiconductor Template)

Figure 9A:
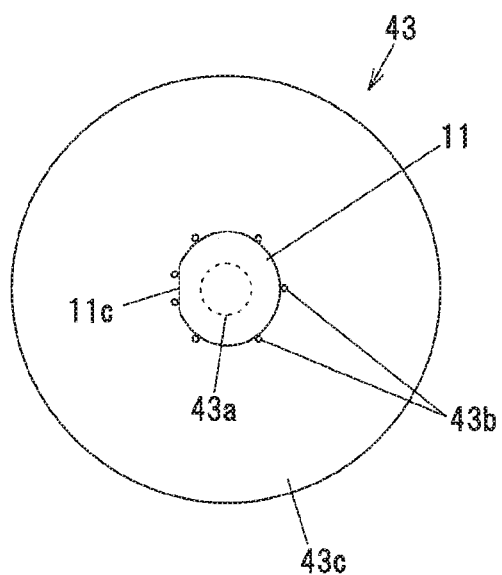
FIG. 9A is a top view showing the heterogeneous substrate held by a substrate holder in Example 3.
Figure 9B:
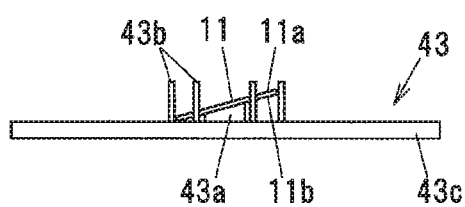
FIG. 9B is a side view showing the heterogeneous substrate held by the substrate holder in Example 3.

Ten nitride semiconductor templates 10 obtained through the above-described process were subjected to film thickness measurement using a film thickness measuring apparatus, warpage measurement, X-ray rocking curve measurement using an X-ray diffractometer, and surface observation using an optical microscope. The results are shown in Table 2.

shape, such as triangular pyramid, with a diameter of 2.6 µm and a height of 1.6 µm and were spaced at intervals of 0.4 µm. Then, a carbon substrate holder 43 shown in FIGS. 9A and 9B was used as the substrate holder 40. FIGS. 9A and 9B are respectively top and side views showing the heterogeneous substrate 11 held by the substrate holder 4 in Example 3.

The substrate holder 43 had a plate-shaped base 43c, a protrusion 43a for supporting the plane 11b of the heterogeneous substrate 11, and plural protrusions 43b for supporting the side surface of the heterogeneous substrate 11. The upper surface of the protrusion 43a had an inclination of 15° with respect to the upper surface of the base 43c, and the heterogeneous substrate 11 was held by the substrate holder 43 at an inclination of 15° with respect to the upper surface of the base 43c.

TABLE 2

|  | Thickness of Front surface layer [µm] | In-plane thickness variation of Front surface layer [%] | Thickness of Back surface layer [µm] | Film thickness difference between Front and Back surface layers [µm] | Warpage [µm] | FWHM, GaN (0004) plane [arcsec] | FWHM, GaN (10-12) plane [arcsec] | Number of Pits |
|---|---|---|---|---|---|---|---|---|
| 1 | 10.0 | 3.7 | 8.9 | 1.1 | 32.8 | 229 | 301 | 2 |
| 2 | 10.6 | 3.8 | 9.3 | 1.3 | 40.6 | 235 | 291 | 0 |
| 3 | 10.3 | 3.7 | 9.4 | 0.9 | 32.5 | 227 | 289 | 0 |
| 4 | 10.4 | 3.9 | 9.2 | 1.2 | 36.1 | 225 | 306 | 1 |
| 5 | 10.1 | 3.9 | 8.8 | 1.3 | 30.6 | 230 | 300 | 1 |
| 6 | 10.3 | 3.8 | 8.8 | 1.5 | 37.9 | 231 | 303 | 0 |
| 7 | 10.4 | 3.7 | 9.4 | 1 | 35.6 | 237 | 296 | 3 |
| 8 | 10.6 | 3.9 | 9.1 | 1.5 | 36.1 | 236 | 301 | 4 |
| 9 | 10.2 | 3.8 | 9.2 | 1 | 47.2 | 232 | 299 | 0 |
| 10 | 10.0 | 3.7 | 8.6 | 1.4 | 33.3 | 224 | 298 | 1 |
| Average | 10.3 | 3.8 | 9.1 | 1.2 | 36.3 | 230.6 | 298.4 | 1.2 |

In each of the nitride semiconductor templates 10, the second nitride semiconductor layer 15 was formed on the plane 11b of the heterogeneous substrate 11 in a region outside a circle which is centered at the center of the heterogeneous substrate 11 and has a 2-mm smaller radius than the radius of the heterogeneous substrate 11 (75 mm).

In Example 2, the first nitride semiconductor layers 13 had good crystallinity and the nitride semiconductor templates 10 with small warpage were obtained, as shown in Table 2.

Example 3

(Manufacturing of Nitride Semiconductor Template)

In Example 3, a single-mirror-surface PSS having a diameter of 50.8 mm and a thickness of 430 µm was used as the heterogeneous substrate 11. The pattern on the PSS was composed of plural raised portions which had a cone-like The protrusion 43a supporting the plane 11b of the heterogeneous substrate 11 was in contact with a circle on the plane 11b which is centered at the center of the heterogeneous substrate 11 and has a 2.7-mm smaller radius than the radius of the heterogeneous substrate 11 (25.4 mm).

In Example 3, growth time of undoped GaN crystal films constituting the first nitride semiconductor layer 13 and the second nitride semiconductor layer 15 was 13 minutes but the other steps and the conditions thereof were the same as those in Example 1.

(Evaluation of the Nitride Semiconductor Template)

Ten nitride semiconductor templates 10 obtained through the above-described process were subjected to film thickness measurement using a film thickness measuring apparatus, warpage measurement, X-ray rocking curve measurement using an X-ray diffractometer, and surface observation using an optical microscope. The results are shown in Table 3.

TABLE 3

|  | Thickness of Front surface layer [µm] | In-plane thickness variation of Front surface layer [%] | Thickness of Back surface layer [µm] | Film thickness difference between Front and Back surface layers [µm] | Warpage [µm] | FWHM, GaN (0004) plane [arcsec] | FWHM, GaN (10-12) plane [arcsec] | Number of Pits |
|---|---|---|---|---|---|---|---|---|
| 1 | 10.3 | 2.6 | 8.4 | 1.9 | 48.3 | 230 | 271 | 0 |
| 2 | 10.3 | 2.4 | 8.1 | 2.2 | 53.1 | 231 | 253 | 0 |
| 3 | 10.5 | 2.1 | 8.3 | 2.2 | 51.3 | 227 | 254 | 0 |
| 4 | 10.2 | 2.4 | 8.0 | 2.2 | 47.2 | 235 | 261 | 0 |
| 5 | 10.4 | 2.3 | 8.4 | 2 | 55.4 | 232 | 259 | 2 |
| 6 | 10.6 | 2.4 | 8.2 | 2.4 | 51.2 | 219 | 248 | 0 |
| 7 | 10.1 | 2.6 | 8.6 | 1.5 | 50.2 | 236 | 270 | 0 |

TABLE 3-continued

|  | Thickness of Front surface layer [μm] | In-plane thickness variation of Front surface layer [%] | Thickness of Back surface layer [μm] | Film thickness difference between Front and Back surface layers [μm] | Warpage [μm] | FWHM, GaN (0004) plane [arcsec] | FWHM, GaN (10-12) plane [arcsec] | Number of Pits |
|---|---|---|---|---|---|---|---|---|
| 8 | 10.3 | 2.5 | 8.1 | 2.2 | 46.3 | 230 | 266 | 1 |
| 9 | 10.1 | 2.1 | 8.2 | 1.9 | 49.1 | 227 | 256 | 1 |
| 10 | 10.2 | 2.2 | 8.2 | 2 | 49.4 | 223 | 263 | 1 |
| Average | 10.3 | 2.4 | 8.3 | 2.1 | 50.2 | 229.0 | 260.1 | 0.5 |

In each of the nitride semiconductor templates 10, the second nitride semiconductor layer 15 was formed on the plane 11b of the heterogeneous substrate 11 in a region outside a circle which is centered at the center of the heterogeneous substrate 11 and has a 12.7-mm smaller radius than the radius of the heterogeneous substrate 11 (25.4 mm).

In Example 3, the first nitride semiconductor layers 13 had good crystallinity and the nitride semiconductor templates 10 with small warpage were obtained, as shown in Table 3.

Comparative Example 1

(Manufacturing of Nitride Semiconductor Template)

Figure 10A:
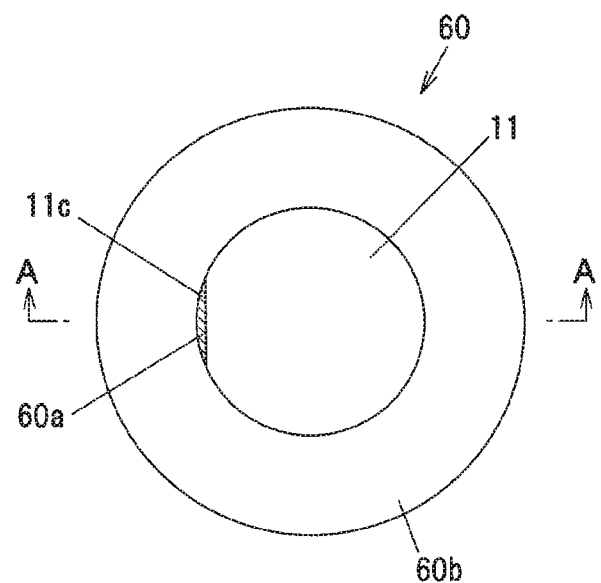
FIG. 10A is a top view showing the heterogeneous substrate held by a substrate holder in Comparative Example 1.
Figure 10B:
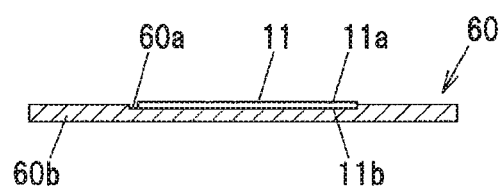
FIG. 10B is a vertical cross-sectional view showing the heterogeneous substrate held by the substrate holder in Comparative Example 1.

In Comparative Example 1, a single-mirror-surface FSS having a diameter of 100 mm and a thickness of 650 μm was used as the heterogeneous substrate 11. Then, a substrate holder 60 shown in FIGS. 10A and 10B was used as the substrate holder 40. FIGS. 10A and 10B are respectively top and side views showing the heterogeneous substrate 11 held by the substrate holder 60 in Comparative Example 1.

The substrate holder 60 was formed of a plate-shaped base 60b having a spotface 60a (without hole) for placing the heterogeneous substrate 11. The entire plane 11b of the heterogeneous substrate 11 was in contact with the bottom surface of the spotface 60a. The depth of the spotface 60a was 0.5 mm In Comparative Example 1, growth time of undoped GaN crystal films constituting the first nitride semiconductor layer 13 and the second nitride semiconductor layer 15 was 10 minutes but the other steps and the conditions thereof were the same as those in Example 1.

(Evaluation of the Nitride Semiconductor Template)

Ten nitride semiconductor templates 10 obtained through the above-described process were subjected to film thickness measurement using a film thickness measuring apparatus, warpage measurement, X-ray rocking curve measurement using an X-ray diffractometer, and surface observation using an optical microscope. The results are shown in Table 4.

TABLE 4

|  | Thickness of Front surface layer [μm] | In-plane thickness variation of Front surface layer [%] | Thickness of Back surface layer [μm] | Film thickness difference between Front and Back surface layers [μm] | Warpage [μm] | FWHM, GaN (0004) plane [arcsec] | FWHM, GaN (10-12) plane [arcsec] | Number of Pits |
|---|---|---|---|---|---|---|---|---|
| 1 | 10.2 | 1.2 | 0 | 10.2 | 243.2 | 227 | 309 | 0 |
| 2 | 10 | 1.3 | 0 | 10 | 239.7 | 231 | 300 | 1 |
| 3 | 10.3 | 1.1 | 0 | 10.3 | 242.3 | 230 | 310 | 1 |
| 4 | 10.4 | 1.1 | 0 | 10.4 | 232.6 | 228 | 297 | 0 |
| 5 | 10.1 | 1.2 | 0 | 10.1 | 237.6 | 237 | 291 | 2 |
| 6 | 10.4 | 1.3 | 0 | 10.4 | 244.6 | 229 | 283 | 3 |
| 7 | 10.7 | 1.4 | 0 | 10.7 | 246.8 | 237 | 302 | 1 |
| 8 | 10.3 | 1.2 | 0 | 10.3 | 229.6 | 233 | 303 | 4 |
| 9 | 10.2 | 1.4 | 0 | 10.2 | 248.4 | 231 | 312 | 0 |
| 10 | 10.2 | 1.3 | 0 | 10.2 | 232.3 | 227 | 296 | 0 |
| Average | 10.3 | 1.3 | 0.0 | 10.3 | 239.7 | 231.0 | 300.3 | 1.2 |

As shown in Table 4, in the nitride semiconductor templates 10 of Comparative Example 1, crystallinity of the first nitride semiconductor layers 13 was good but the amount of warpage (Warp) was large, with an average of more than 100 μm. It is considered that this is because the second nitride semiconductor layer 15 was not formed and it was thus not possible to reduce warpage.

Comparative Example 2

(Manufacturing of Nitride Semiconductor Template)

In Comparative Example 2, a double-mirror-surface FSS having a diameter of 150 mm and a thickness of 1300 μm was used as the heterogeneous substrate 11. Then, the substrate holder 60 shown in FIGS. 10A and 10B was used as the substrate holder 40. The depth of the spotface 60a of the substrate holder 60 in Comparative Example 2 was 1.0 mm In Comparative Example 2, growth time of undoped GaN crystal films constituting the first nitride semiconductor layer 13 and the second nitride semiconductor layer 15 was 12 minutes but the other steps and the conditions thereof were the same as those in Comparative Example 1.

(Evaluation of the Nitride Semiconductor Template)

Ten nitride semiconductor templates 10 obtained through the above-described process were subjected to film thickness measurement using a film thickness measuring apparatus, warpage measurement, X-ray rocking curve measurement using an X-ray diffractometer, and surface observation using an optical microscope. The results are shown in Table 5.

TABLE 5

| | Thickness of Front surface layer [μm] | In-plane thickness variation of Front surface layer [%] | Thickness of Back surface layer [μm] | Film thickness difference between Front and Back surface layers [μm] | Warpage [μm] | FWHM, GaN (0004) plane [arcsec] | FWHM, GaN (10-12) plane [arcsec] | Number of Pits |
|---|---|---|---|---|---|---|---|---|
| 1 | 10.4 | 1.9 | 0 | 10.4 | 167.7 | 233 | 296 | 2 |
| 2 | 10.1 | 1.6 | 0 | 10.1 | 157.1 | 231 | 300 | 3 |
| 3 | 10.5 | 1.4 | 0 | 10.5 | 160.3 | 225 | 304 | 1 |
| 4 | 10.2 | 1.7 | 0 | 10.2 | 170.2 | 230 | 290 | 0 |
| 5 | 10.6 | 1.7 | 0 | 10.6 | 172.3 | 233 | 287 | 1 |
| 6 | 10.1 | 1.5 | 0 | 10.1 | 163.7 | 228 | 303 | 1 |
| 7 | 10.8 | 1.8 | 0 | 10.8 | 179.6 | 229 | 305 | 1 |
| 8 | 10.3 | 1.9 | 0 | 10.3 | 172.3 | 227 | 301 | 3 |
| 9 | 10.5 | 2 | 0 | 10.5 | 164.6 | 226 | 293 | 4 |
| 10 | 10.5 | 1.6 | 0 | 10.5 | 166.4 | 234 | 296 | 0 |
| Average | 10.4 | 1.7 | 0.0 | 10.4 | 167.4 | 229.6 | 297.5 | 1.6 |

As shown in Table 5, in the nitride semiconductor templates 10 of Comparative Example 2, crystallinity of the first nitride semiconductor layers 13 was good but the amount of warpage (Warp) was large, with an average of more than 100 μm. It is considered that this is because the second nitride semiconductor layer 15 was not formed and it was thus not possible to reduce warpage.

Comparative Example 3

(Manufacturing of Nitride Semiconductor Template)

In Comparative Example 3, a single-mirror-surface PSS having a diameter of 50.8 mm and a thickness of 430 μm was used as the heterogeneous substrate 11. The pattern on the PSS was composed of plural raised portions which had a cone-like shape, such as triangular pyramid, with a diameter of 2.6 μm and a height of 1.6 μm and were spaced at intervals of 0.4 μm. Then, the substrate holder 60 shown in FIGS. 10A and 10B was used as the substrate holder 40. The depth of the spotface 60a of the substrate holder 60 in Comparative Example 3 was 0.4 mm In Comparative Example 3, growth time of undoped GaN crystal films constituting the first nitride semiconductor layer 13 and the second nitride semiconductor layer 15 was 8 minutes but the other steps and the conditions thereof were the same as those in Comparative Example 1.

(Evaluation of the Nitride Semiconductor Template)

Ten nitride semiconductor templates 10 obtained through the above-described process were subjected to film thickness measurement using a film thickness measuring apparatus, warpage measurement, X-ray rocking curve measurement using an X-ray diffractometer, and surface observation using an optical microscope. The results are shown in Table 6.

TABLE 6

| | Thickness of Front surface layer [μm] | In-plane thickness variation of Front surface layer [%] | Thickness of Back surface layer [μm] | Film thickness difference between Front and Back surface layers [μm] | Warpage [μm] | FWHM, GaN (0004) plane [arcsec] | FWHM, GaN (10-12) plane [arcsec] | Number of Pits |
|---|---|---|---|---|---|---|---|---|
| 1 | 10.3 | 0.8 | 0 | 10.3 | 126.9 | 231 | 256 | 3 |
| 2 | 10.5 | 0.6 | 0 | 10.5 | 130.2 | 234 | 269 | 0 |
| 3 | 9.9 | 0.9 | 0 | 9.9 | 125.6 | 232 | 254 | 0 |
| 4 | 10.1 | 1 | 0 | 10.1 | 124.9 | 224 | 259 | 3 |
| 5 | 10.1 | 1.3 | 0 | 10.1 | 133.2 | 221 | 262 | 2 |
| 6 | 10.6 | 0.7 | 0 | 10.6 | 121.1 | 230 | 270 | 1 |
| 7 | 10.2 | 1.1 | 0 | 10.2 | 128.6 | 231 | 250 | 3 |
| 8 | 10.3 | 0.9 | 0 | 10.3 | 127.3 | 226 | 257 | 0 |
| 9 | 10.2 | 1.2 | 0 | 10.2 | 134.3 | 233 | 267 | 1 |
| 10 | 10.4 | 1.1 | 0 | 10.4 | 128.4 | 230 | 248 | 1 |
| Average | 10.3 | 1.0 | 0.0 | 10.3 | 128.1 | 229.2 | 259.2 | 1.4 |

As shown in Table 6, in the nitride semiconductor templates 10 of Comparative Example 3, crystallinity of the first nitride semiconductor layers 13 was good but the amount of warpage (Warp) was large, with an average of more than 100 μm. It is considered that this is because the second nitride semiconductor layer 15 was not formed and it was thus not possible to reduce warpage.

Comparative Example 4

(Manufacturing of Nitride Semiconductor Template)

In Comparative Example 4, a single-mirror-surface FSS having a diameter of 150 mm and a thickness of 1300 μm was used as the heterogeneous substrate 11. Then, the substrate holder 42 shown in FIGS. 8A and 8B was used as the substrate holder 40 in the same manner as Example 2.

In Comparative Example 4, the upper surface of the protrusion 42a had an inclination of 32° with respect to the upper surface of the base 42c, and the heterogeneous substrate 11 was held by the substrate holder 42 at an inclination of 32° with respect to the upper surface of the base 42c.

The protrusion 42a supporting the plane 11b of the heterogeneous substrate 11 was in contact with a circle on the plane 11b which is centered at the center of the heterogeneous substrate 11 and has a 2-mm smaller radius than the radius of the heterogeneous substrate 11 (75 mm).

Crystal growth in Comparative Example 4 was performed under the same conditions as in Example 2.

(Evaluation of the Nitride Semiconductor Template)

Ten nitride semiconductor templates 10 obtained through the above-described process were subjected to film thickness measurement using a film thickness measuring apparatus, warpage measurement, X-ray rocking curve measurement using an X-ray diffractometer, and surface observation using an optical microscope. The results are shown in Table 7.

TABLE 7

|   | Thickness of Front surface layer [μm] | In-plane thickness variation of Front surface layer [%] | Thickness of Back surface layer [μm] | Film thickness difference between Front and Back surface layers [μm] | Warpage [μm] | FWHM, GaN (0004) plane [arcsec] | FWHM, GaN (10-12) plane [arcsec] | Number of Pits |
|---|---|---|---|---|---|---|---|---|
| 1 | 10.3 | 4.1 | 9.3 | 1 | 30.2 | 242 | 301 | 0 |
| 2 | 10.7 | 3.9 | 9.4 | 1.3 | 39.1 | 222 | 311 | 0 |
| 3 | 10.1 | 4.2 | 9.3 | 0.8 | 35 | 226 | 314 | 3 |
| 4 | 10.3 | 4.6 | 9.2 | 1.1 | 37.8 | 245 | 309 | 0 |
| 5 | 10.2 | 3.9 | 9.1 | 1.1 | 38.8 | 231 | 316 | 2 |
| 6 | 10.4 | 4.1 | 8.9 | 1.5 | 44.6 | 236 | 307 | 1 |
| 7 | 10.5 | 4.0 | 9.4 | 1.1 | 46.1 | 232 | 309 | 1 |
| 8 | 10.1 | 4.1 | 8.8 | 1.3 | 40.6 | 229 | 316 | 1 |
| 9 | 10.0 | 4.4 | 9.3 | 0.7 | 38.2 | 236 | 312 | 0 |
| 10 | 10.2 | 4.0 | 9.2 | 1 | 37.9 | 234 | 320 | 1 |
| Average | 10.3 | 4.1 | 9.2 | 1.1 | 38.8 | 233.3 | 311.5 | 0.9 |

In each of the nitride semiconductor templates 10, the second nitride semiconductor layer 15 was formed on the plane 11b of the heterogeneous substrate 11 in a region outside a circle which is centered at the center of the heterogeneous substrate 11 and has a 2-mm smaller radius than the radius of the heterogeneous substrate 11 (75 mm).

As shown in Table 7, in the nitride semiconductor templates 10 of Comparative Example 4, crystallinity of the first nitride semiconductor layers 13 was good but the in-plane thickness variation of the first nitride semiconductor layers 13 was large, with an average of more than 4.0%. Since the in-plane thickness variation specified for nitride semiconductor layer in semiconductor light-emitting element such as LED element is generally not more than 4.0%, the nitride semiconductor templates 10 in Comparative Example 4 are not suitable for use in manufacture of semiconductor light-emitting elements. The cause of the large in-plane thickness variation of the first nitride semiconductor layers 13 is considered to be an inclination of the heterogeneous substrate 11 which was more than 30° with respect to the upper surface of the base 42c.

Although the embodiments and examples of the invention have been described, the invention is not intended to be limited to the embodiments and examples, and the various kinds of modifications can be implemented without departing from the gist of the invention.

For example, the nitride semiconductor template 10 and the epitaxial wafer 20 may be manufactured by a crystal growth method other than the HYPE method, e.g., may be formed by the MOVPE method or the MBE method, etc. In addition, the method of manufacturing the nitride semiconductor template 10 is applicable to general thin film growth on a heterogeneous substrate having a different coefficient of thermal expansion, and it is possible to obtain the warpage reducing effect equivalent to when manufacturing the nitride semiconductor template 10.

In addition, the invention according to claims is not to be limited to the above-mentioned embodiments and examples. Further, please note that all combinations of the features described in the embodiments and examples are not necessary to solve the problem of the invention.

INDUSTRIAL APPLICABILITY

The invention is applicable to a nitride semiconductor template used for manufacturing a nitride semiconductor element such as light-emitting element.

REFERENCE SIGNS LIST

10 NITRIDE SEMICONDUCTOR TEMPLATE
11 HETEROGENEOUS SUBSTRATE
12, 14 BUFFER LAYER
13 FIRST NITRIDE SEMICONDUCTOR LAYER
15 SECOND NITRIDE SEMICONDUCTOR LAYER
20 EPITAXIAL WAFER
30 LIGHT-EMITTING ELEMENT

The invention claimed is:
1. A nitride semiconductor template, comprising:
    a heterogeneous substrate;
    a first nitride semiconductor layer that is formed on one surface of the heterogeneous substrate, comprises a nitride semiconductor, and has an in-plane thickness variation of not more than 4.0% the in-plane thickness variation being a value of a standard deviation of a film thickness obtained at, measurement points ,divided by an average film thickness of the measurement points in the first nitride semiconductor layer; and
    a second nitride semiconductor layer that is formed on an annular region including an outer periphery of an other surface of the heterogeneous substrate, comprises the nitride semiconductor, and has a thickness of not less than 1 μm.
2. The nitride semiconductor template according to claim 1, wherein the heterogeneous substrate comprises a circular substrate, and
    wherein the annular region comprises a region in the other surface outside a circle that is centered at a center of the heterogeneous substrate and has a 2-mm smaller radius than a radius of the heterogeneous substrate.
3. The nitride semiconductor template according to claim 2, wherein a shape of a region of the other surface surrounded by the annular region is a circle centered at the center of the heterogeneous substrate.
4. The nitride semiconductor template according to claim 2, wherein an amount of warpage (Warp) is not more than 100 μm.

5. The nitride semiconductor template according to claim 2, wherein the nitride semiconductor comprises GaN.

6. An epitaxial wafer, comprising:
the nitride semiconductor template according to claim 2; and
a light-emitting layer formed on the semiconductor template.

7. The nitride semiconductor template according to claim 1, wherein a shape of a region in the other surface surrounded by the annular region is a circle centered at a center of the heterogeneous substrate.

8. The nitride semiconductor template according to claim 7, wherein an amount of warpage (Warp) is not more than 100 μm.

9. The nitride semiconductor template according to claim 7, wherein the nitride semiconductor comprises GaN.

10. An epitaxial wafer, comprising:
the nitride semiconductor template according to claim 7; and
a light-emitting layer formed on the semiconductor template.

11. The nitride semiconductor template according to claim 1, wherein an amount of warpage (Warp) is not more than 100 μm.

12. The nitride semiconductor template according to claim 11, wherein a difference in thickness between the first nitride semiconductor layer and the second nitride semiconductor layer is not more than 5 μm.

13. The nitride semiconductor template according to claim 12, wherein the nitride semiconductor comprises GaN.

14. An epitaxial wafer, comprising:
the nitride semiconductor template according to claim 12; and
a light-emitting layer formed on the semiconductor template.

15. The nitride semiconductor template according to claim 11, wherein the nitride semiconductor comprises GaN.

16. An epitaxial wafer, comprising:
the nitride semiconductor template according to claim 11; and
a light-emitting layer formed on the semiconductor template.

17. The nitride semiconductor template according to claim 1, wherein the nitride semiconductor comprises GaN.

18. An epitaxial wafer, comprising:
the nitride semiconductor template according to claim 17; and
a light-emitting layer formed on the semiconductor template.

19. An epitaxial wafer, comprising:
the nitride semiconductor template according to claim 1; and
a light-emitting layer formed on the semiconductor template.

20. A method for manufacturing a nitride semiconductor template. the method comprising:

growing a first nitride semiconductor layer comprising a nitride semiconductor and having an in-plane thickness variation of not more than 4.0% on one surface of a heterogeneous substrate, the in-plane thickness variation being a value of a standard deviation of a film thickness obtained at measurement points divided ban average film thickness of the measurement points in the first nitride semiconductor layer; and growing a second nitride semiconductor layer comprising the nitride semiconductor and having a thickness of not less than 1 μm on an annular region including an outer periphery of an other surface of the heterogeneous substrate.

21. The method for manufacturing a nitride semiconductor template according to claim 20, wherein the first nitride semiconductor layer and the second nitride semiconductor layer are grown by holding the heterogeneous substrate onto a substrate holder to be inclined at an angle of not less than 0.5° and not more than 30° with respect to an upper surface of a base of the substrate holder, and sending source gases in one or both of parallel and perpendicular directions to the upper surface of the base of the substrate holder while in-plane rotating the substrate holder.

22. The method for manufacturing a nitride semiconductor template according to claim 21, wherein the heterogeneous substrate comprises a circular substrate or comprises a circular substrate with at least one of an orientation flat and an index flat, and the annular region comprises a region in the other surface outside a circle that is centered at a center of the heterogeneous substrate and has a 2-mm smaller radius than the radius of the heterogeneous substrate.

23. The method for manufacturing a nitride semiconductor template according to claim 21, wherein a shape of a region of the other surface surrounded by the annular region is a circle centered at a center of the heterogeneous substrate.

24. The method for manufacturing a nitride semiconductor template according to claim 20, wherein the heterogeneous substrate comprises a circular substrate or a circular substrate with at least one of an orientation flat and an index fiat, and
wherein the annular region comprises a region in the other surface outside a circle that is centered at a center of the heterogeneous substrate and has a 2-mm smaller radius than a radius of the heterogeneous substrate.

25. The method for manufacturing a nitride semiconductor template according to claim 24, wherein a shape of a region of the other surface surrounded by the annular region is a circle centered at the center of the heterogeneous substrate.

26. The method for manufacturing a nitride semiconductor template according to claim 20, wherein a shape of a region in the other surface surrounded by the annular region is a circle centered at a center of the heterogeneous substrate.

* * * * *